(12) United States Patent
Miyake et al.

(10) Patent No.: US 12,237,225 B2
(45) Date of Patent: Feb. 25, 2025

(54) METHOD FOR MANUFACTURING SEMICONDUCTOR DEVICE

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventors: Hiroki Miyake, Nisshin (JP); Tatsuji Nagaoka, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 419 days.

(21) Appl. No.: 17/583,754

(22) Filed: Jan. 25, 2022

(65) Prior Publication Data

US 2022/0246474 A1 Aug. 4, 2022

(30) Foreign Application Priority Data

Feb. 3, 2021 (JP) .................................. 2021-016099

(51) Int. Cl.
*H01L 21/78* (2006.01)
*H01L 21/425* (2006.01)
(Continued)

(52) U.S. Cl.
CPC ............ *H01L 21/78* (2013.01); *H01L 21/425* (2013.01); *H01L 21/46* (2013.01); *H01L 21/461* (2013.01); *H01L 21/479* (2013.01); *H01L 29/045* (2013.01)

(58) Field of Classification Search
CPC ....... H01L 21/78; H01L 21/425; H01L 21/46; H01L 21/461; H01L 21/479; H01L 29/045
See application file for complete search history.

(56) References Cited

U.S. PATENT DOCUMENTS 5,678,744 A 10/1997 Nakamura
2005/0272224 A1 12/2005 Ueda et al.
(Continued)

FOREIGN PATENT DOCUMENTS

JP 2002373868 A * 12/2002
JP 2004148438 A 5/2004
(Continued)

OTHER PUBLICATIONS

Zhi Guo et al., "Anisotropic thermal conductivity in single crystal β-gallium oxide", Applied Physics Letters 106, 111909, Mar. 2015.
(Continued)

*Primary Examiner* — Joseph C. Nicely
(74) *Attorney, Agent, or Firm* — Posz Law Group, PLC

(57) ABSTRACT

A method for manufacturing a semiconductor device includes: preparing a substrate made of a compound semiconductor containing a first element and a second element that is bonded to the first element and has an electronegativity smaller than that of the first element by 1.5 or more; causing an electric current to flow in the substrate; and dividing the substrate at a position including a current region where the electric current is caused to flow and along a cleavage plane of the substrate. A method for manufacturing a semiconductor device includes: stacking a first substrate and a second substrate each made of the compound semiconductor; and bonding the first substrate and the second substrate by causing an electric current to flow between the first substrate and the second substrate.

18 Claims, 4 Drawing Sheets

(51) Int. Cl.
      *H01L 21/46*          (2006.01)
      *H01L 21/461*       (2006.01)
      *H01L 21/479*       (2006.01)
      *H01L 29/04*          (2006.01)

(56)           References Cited

U.S. PATENT DOCUMENTS

| | | |
|---|---|---|
| 2017/0200790 A1 | 7/2017 | Hitora et al. |
| 2020/0144376 A1 | 5/2020 | Hitora et al. |
| 2020/0273951 A1* | 8/2020 | Nagaoka ................ H01L 21/78 |
| 2021/0119000 A1 | 4/2021 | Hitora et al. |
| 2021/0384069 A1 | 12/2021 | Ou et al. |

FOREIGN PATENT DOCUMENTS

| | | | |
|---|---|---|---|
| JP | 2014-203953 A | 10/2014 |
| JP | 2018-018999 A | 2/2018 |
| JP | 2019-126838 A | 8/2019 |

OTHER PUBLICATIONS

Antonella Parisini and Roberto Fornari, "Analysis of the scattering mechanisms controlling electron mobility in β-Ga2O3 crystals", Semicond. Sci. Technol. 31 035023, Feb. 2016.

* cited by examiner

METHOD FOR MANUFACTURING SEMICONDUCTOR DEVICE

CROSS REFERENCE TO RELATED APPLICATION

The present application claims the benefit of priority from Japanese Patent Application No. 2021-016099 filed on Feb. 3, 2021. The entire disclosures of the above application are incorporated herein by reference.

TECHNICAL FIELD

The present disclosure relates to a method for manufacturing a semiconductor device.

BACKGROUND

In regard to a method for manufacturing a semiconductor device, various techniques for separating and for bonding a substrate composed of a compound semiconductor have been proposed. For example, as technique for cutting a substrate containing gallium oxide in a method for manufacturing a semiconductor device, first, a laser beam may be applied along a scheduled cutting line on the substrate to form a modified region along the scheduled cutting line of the substrate. The modified region is more brittle than the other regions of the substrate. Then, the substrate may be cut along the scheduled cutting line by a dicing blade. In this manufacturing method, since the substrate may be cut at the modified region formed along the scheduled cutting line, the substrate may be cut at a higher speed than the conventional dicing.

SUMMARY

The present disclosure provides a technique for suppressing damage to a substrate made of a compound semiconductor by efficiently performing dividing of the substrate. The present disclosure also provides a technique for suppressing damage to a substrate made of a compound semiconductor by efficiently performing bonding of substrates.

According to a first aspect of the present disclosure, a method for manufacturing a semiconductor device may include: preparing a substrate made of a compound semiconductor containing a first element and a second element that is bonded with the first element and has an electronegativity smaller than that of the first element by 1.5 or more; causing an electric current to flow in the substrate; and dividing the substrate at a position including a current region to which the electric current is caused to flow and along a cleavage plane. The electronegativity is a value indicating the ability of an atom in the molecule to attract an electron. In the present disclosure, the electronegativity refers to Pauling's electronegativity.

According to a second aspect of the present disclosure a method for manufacturing a semiconductor device may include: stacking a first substrate and a second substrate; and bonding the first substrate and the second substrate by causing an electric current to flow between the first substrate and the second substrate. The first substrate and the second substrate are each made of a compound semiconductor. The compound semiconductor contains a first element and a second element that is bonded to the first element and has an electronegativity smaller than that of the first element by 1.5 or more.

BRIEF DESCRIPTION OF THE DRAWINGS

Features and advantages of the present disclosure will become more apparent from the following detailed description made with reference to the accompanying drawings, in which like parts are designated by like reference numbers and in which.

DETAILED DESCRIPTION

Figure 1:
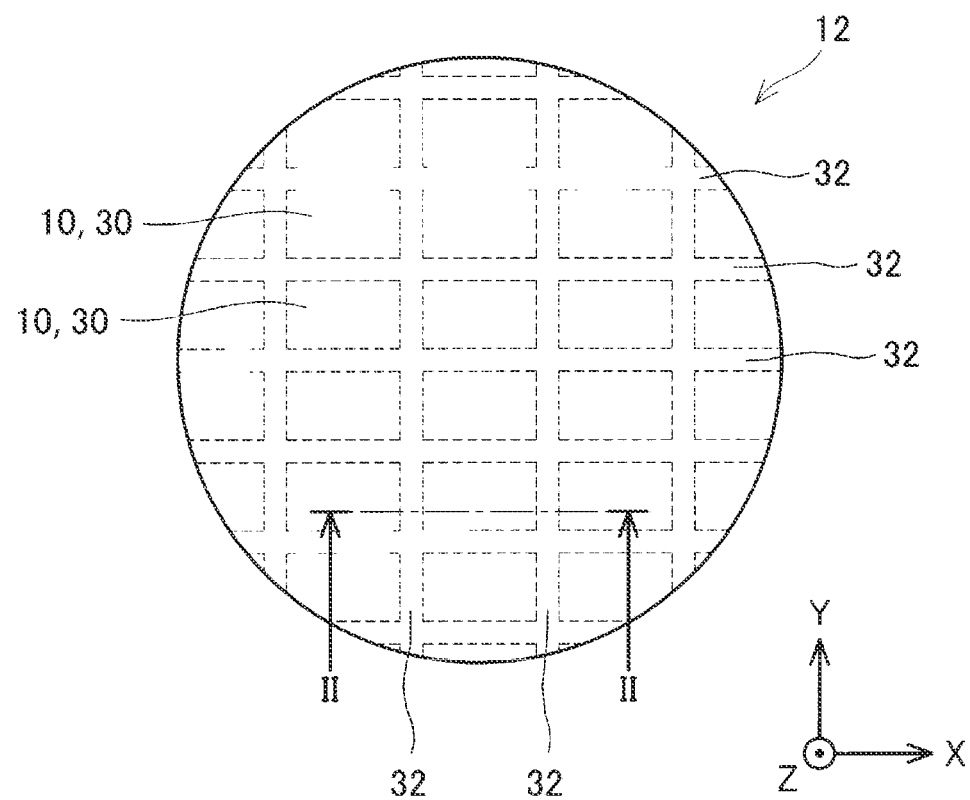
FIG. 1 is a plan view of a semiconductor substrate in a manufacturing method according to a first embodiment.

In a manufacturing method of a semiconductor device, a laser beam may be applied along a scheduled cutting line of a substrate to form a modified region along the scheduled cutting line of the substrate. If the width of the modified region is wider than the width of a dicing blade used to cut the substrate, the modified region remains on a cut surface of the substrate after the substrate is cut. Since the modified region has been damaged by the laser beam, the cut surface may not be even, which may affect the performance of the semiconductor device.

Embodiments of the present disclosure will be described with reference to the technical elements listed hereinafter. The following technical elements may be useful even if used independently.

In an embodiment of the present disclosure, a method for manufacturing a semiconductor device includes steps of: preparing a substrate made of a compound semiconductor containing a first element and a second element that is bonded to the first element and has an electronegativity smaller than that of the first element by 1.5 or more; causing an electric current to flow in the substrate; and dividing the substrate at a position including a current region where the electric current is caused to flow and along a cleavage plane of the substrate.

The electronegativity is a value indicating the ability of an atom in the molecule to attract an electron. In the present disclosure, the electronegativity refers to Pauling's electronegativity.

In such a manufacturing method, the substrate made of the compound semiconductor containing the first element and the second element that is bonded to the first element and having the electronegativity smaller than the first element by 1.5 or more is prepared. It is known that, when the difference in electronegativity between the first element and the second element is 1.5 or more, the bonding between the first element and the second element exhibits an ionic bonding property. In the compound semiconductor exhibiting the ionic bonding property, the charge generated due to the flow of an electric current moves inside the compound semiconductor, so that the polarity inside the crystal is likely to be easily disturbed. In addition, thermal stress is likely to be generated due to the flow of electric current, and the crystal structure is likely to be easily distorted. Namely, the crystal structure of the compound semiconductor exhibiting the ionic bonding property is likely to be changed due to the flow of electric current. In the manufacturing method of the embodiment, by utilizing this property, the electric current is caused to flow in the substrate, so that the substrate is divided along a cleavage plane of the substrate. Accordingly, the substrate can be efficiently divided while suppressing damage to the divided surface.

In an embodiment of the present disclosure, in the step of causing the electric current to flow in the substrate in the manufacturing method, for example, a probe may be brought into contact with the substrate and the electric current may be caused to flow between the substrate and the probe.

In such a configuration, a current region where the electric current flows in the substrate can be controlled by adjusting the position where the probe is brought into contact with the substrate. As such, the substrate can be easily divided along a cleavage plane of the substrate.

In an embodiment of the present disclosure, the manufacturing method may further include a step of forming an electrode on a surface of the current region of the substrate. In the step of causing the electric current to flow in the substrate, the electric current may be caused to flow in the substrate through the electrode.

In such a configuration, the current region where the electric current flows in the substrate can be controlled by adjusting the position where the electrode is formed. As such, the substrate can be easily divided along the cleavage plane of the substrate.

In an embodiment of the present disclosure, in the step of forming the electrode in the manufacturing method, the electrode may be formed along the cleavage plane on the surface of the current region.

In such a configuration, the electrode is formed on the surface of the substrate along the cleavage plane. Therefore, the electric current can easily flow along the cleavage plane, and thus it is easy to apply stress locally along the cleavage plane.

In an embodiment of the present disclosure, the manufacturing method may further include a step of introducing a dopant or a dissimilar material different from the compound semiconductor into the current region to increase the resistance of the current region higher than that of a peripheral region on the periphery of the current region.

In such a configuration, by introducing the dopant or the dissimilar material in the current region where the electric current is caused to flow, the resistance in the current region is increased higher than that in the peripheral region. Therefore, when the electric current is caused to flow, the temperature in the current region is likely to rise more than in the peripheral region, and thus a large thermal stress can be applied to the current region.

In an embodiment of the present disclosure, the manufacturing method may further include a step of introducing a dopant or a dissimilar material different from the compound semiconductor into the current region to increase a thermal resistance of the current region higher than that of a peripheral region on the periphery of the current region.

In such a configuration, by introducing the dopant or the dissimilar material in the current region where the electric current is caused to flow, the resistance in the current region is increased higher than that in the peripheral region. Therefore, when the electric current is caused to flow, heat tends to easily stagnate in the current region, and thus the temperature in the current region is likely to rise more than in the peripheral region. As such, a large thermal stress can be applied to the current region.

In an embodiment of the present disclosure, in the manufacturing method, the compound semiconductor may be an oxide semiconductor, and the first element may be oxygen. Further, the compound semiconductor may be made of $\beta$-$Ga_2O_3$. The cleavage plane may be a (100) crystal plane and/or a (001) crystal plane of $\beta$-$Ga_2O_3$.

In the compound semiconductor made of $\beta$-$Ga_2O_3$, cleavage is likely to occur along the (100) crystal plane or the (001) crystal plane. Therefore, if the substrate is divided along the (100) crystal plane or the (001) crystal plane of $\beta$-$Ga_2O_3$, the substrate can be easily divided.

In an embodiment of the present disclosure, a method for manufacturing a semiconductor device includes steps of: stacking a first substrate and a second substrate; and bonding the first substrate and the second substrate by causing an electric current to flow between the first substrate and the second substrate. The first substrate and the second substrate are each made of a compound semiconductor. The compound semiconductor contains a first element and a second element that is bonded to the first element and has an electronegativity smaller than that of the first element by 1.5 or more.

In such a manufacturing method, the first substrate and the second substrate are stacked on top of the other. The first substrate and the second substrate are each made of the compound semiconductor containing the first element and the second element that is bonded to the first element and has the electronegativity smaller than that of the first element by 1.5 or more. The crystal structure of the compound semiconductor exhibiting an ionic bonding property is likely to be disturbed due to the flow of the electric current. Therefore, by causing the electric current to flow between the first substrate and the second substrate, the crystal structure at the interface between the first substrate and the second substrate is disturbed, and the vicinity of the interface is melted. As such, when the flow of the electric current is stopped, the disordered crystal structures are realigned in the course of solidifying the molten semiconductor material. As a result, the first substrate and the second substrate can be efficiently bonded.

In an embodiment of the present disclosure, the manufacturing method may further include a step of introducing a dopant or a dissimilar material different from the compound semiconductor different on the surface of the first substrate, prior to the step of stacking the first substrate and the second substrate. In the step of stacking the first substrate and the second substrate, the second substrate may be stacked on the surface of the first substrate.

In such a configuration, the resistance of the surface of the first substrate is increased by introducing the dopant or the dissimilar material. Then, the second substrate is stacked on the surface of the first substrate having the increased resistance. Therefore, when the electric current is caused to flow between the first substrate and the second substrate, the temperature at the contact surface of the first substrate with the second substrate tends to rise. Therefore, at the interface between the first substrate and the second substrate, the semiconductor material is easily melted, and the first substrate and the second substrate can be efficiently bonded to each other.

In an embodiment of the present disclosure, the manufacturing method may further include a step of increasing a resistance of at least one of a surface layer portion of the first substrate and a surface layer portion of the second substrate by annealing at least one of the first substrate and the second substrate, prior to the step of bonding the first substrate and the second substrate.

In such a configuration, the resistance of the interface between the first substrate and the second substrate can be increased as the first substrate and the second substrate are brought into contact with each other such that the surface layer portion at which the resistance is increased is located at the interface between the first substrate and the second substrate. Therefore, when the electric current is caused to flow between the first substrate and the second substrate, the temperature at the interface between the first substrate and the second substrate, that is, the temperature at the contact surface between the first substrate and the second substrate tends to rise. As a result, the semiconductor material is easily melted at the interface, and the first substrate and the second substrate are efficiently bonded to each other.

In an embodiment of the present disclosure, the manufacturing method may further include a step of increasing a thermal resistance of at least one of a surface layer portion of the first substrate and a surface layer portion of the second substrate by annealing at least one of the first substrate and the second substrate, prior to the step of bonding the first substrate and the second substrate.

In such a configuration, the thermal resistance at the interface between the first substrate and the second substrate can be increased as the first substrate and the second substrate are brought into contact with each other such that the surface layer portion at which the thermal resistance is increased is located at the interface between the first substrate and the second substrate. Therefore, when the electric current is caused to flow between the first substrate and the second substrate, heat is likely to stagnate at the interface between the first substrate and the second substrate, that is, at the contact surface between the first substrate and the second substrate, and thus the temperature at the interface is likely to easily rise. As a result, the semiconductor material is easily melted at the interface, and the first substrate and the second substrate are efficiently bonded to each other.

In an embodiment of the present disclosure, in the manufacturing method, the compound semiconductor may be an oxide semiconductor, and the first element may be oxygen. Further, the compound semiconductor may be made of $\beta$-$Ga_2O_3$.

Exemplary embodiments of the present disclosure will be further described hereinafter with reference to first to third embodiments.

First Embodiment

A method for manufacturing a semiconductor device 10 of a first embodiment will be described with reference to the drawings. In the manufacturing method of the first embodiment, the semiconductor device 10 is manufactured by using a wafer-state semiconductor substrate 12, as shown in FIG. 1. The manufacturing method of the first embodiment is characterized by a process of dividing the semiconductor substrate 12 made of a specific material, which will be described later. This manufacturing method can be adopted for various semiconductor devices using the specific material and their semi-finished products. Hereinafter, the process of dividing the semiconductor substrate 12 will be mainly described, and the description of other manufacturing processes will be omitted.

The semiconductor substrate 12 shown in FIG. 1 is made of a compound semiconductor. Specifically, the semiconductor substrate 12 is made of $\beta$-$Ga_2O_3$. However, the material of the semiconductor substrate 12 is not limited to $\beta$-$Ga_2O_3$. As a material of the semiconductor substrate 12, a compound semiconductor containing a first element and a second element bonded to each other, and in which a difference in electronegativity between the first element and the second element is 1.5 or more may be used. Generally speaking, it is simply required that the semiconductor substrate 12 is made of a material having an ionic bonding property. In the case of $\beta$-$Ga_2O_3$, O corresponds to the first element and has an electronegativity of 3.44, and Ga corresponds to the second element and has an electronegativity of 1.81. The compound semiconductor constituting the semiconductor substrate 12 may further contain an element different from the first element and the second element. Examples of the compound semiconductor constituting the semiconductor substrate 12 other than $\beta$-$Ga_2O_3$ may include gallium oxide semiconductors such as $(Ga, Rh)_2O_3$, $(Ga, Ir)_2O_3$, $(Ga, Bi)_2O_3$, and $ZnGa_2O_4$, and other oxide semiconductors.

In FIG. 1, a plane including an X direction and a Z direction corresponds to a (100) crystal plane of $\beta$-$Ga_2O_3$, and a plane including a Y direction and the Z direction corresponds to a (001) crystal plane of $\beta$-$Ga_2O_3$. Also, a plane including the X direction and Y direction, that is, a plane along a surface 12a corresponds to a (010) crystal plane of $\beta$-$Ga_2O_3$. In other words, in FIG. 1, the Y direction corresponds to a crystal orientation of [100], the X direction corresponds to a crystal orientation of [001], and the Z direction corresponds to a crystal orientation of [010].

As shown in FIG. 1, the semiconductor substrate 12 has a plurality of element regions 30 each of which is formed with a semiconductor device 10, and scheduled dividing regions 32 around the respective element regions 30. The scheduled dividing regions 32 correspond to regions that are cut later. The element regions 30 are arranged in a grid pattern along the X direction and the Y direction.

Figure 2:
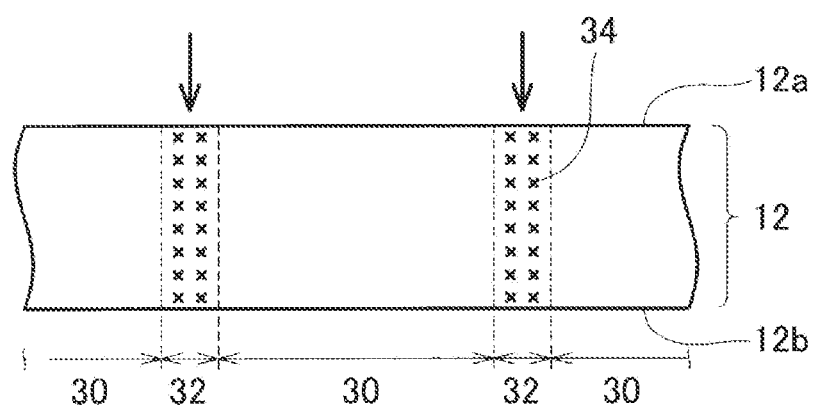
FIG. 2 is a cross-sectional view showing a process of introducing a dopant into the semiconductor substrate.

In the manufacturing method of the first embodiment, first, a dopant is introduced into the semiconductor substrate 12 by ion implantation. In this case, as shown in FIG. 2, the dopant is selectively introduced along the scheduled dividing regions 32. The dopant to be introduced is not particularly limited, but for example, Fe or V can be used. As a result, as shown in FIG. 2, the dopant is introduced into the inside of the semiconductor substrate 12, and a high resistance region 34 is thus formed. The high resistance region 34 has a higher resistance than a peripheral region, that is, the element regions 30, due to the introduction of the dopant. In cross-sectional views subsequent to FIG. 2, the illustration of the internal structure of the semiconductor substrate 12 is omitted.

Figure 3:
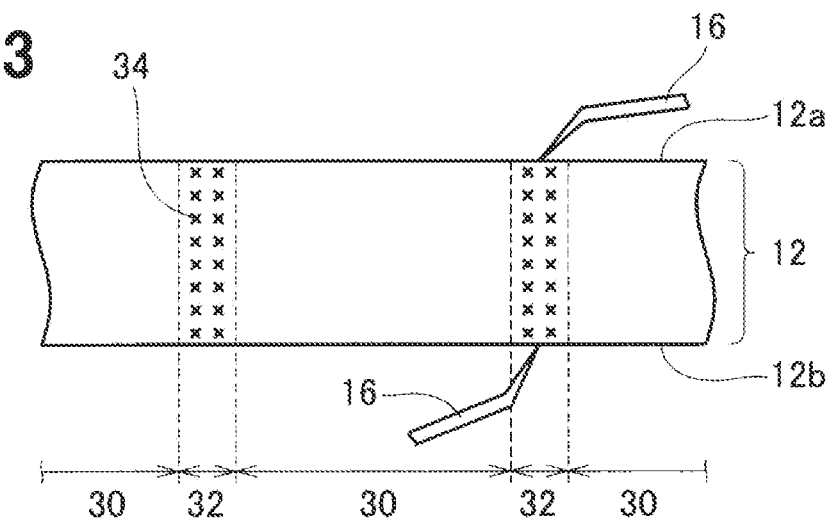
FIG. 3 is a cross-sectional view showing a process of causing an electric current to flow through the semiconductor substrate.

Next, as shown in FIG. 3, probes 16 are brought into contact with a front surface 12a and a back surface 12b of the semiconductor substrate 12, respectively. Here, each probe 16 is brought into contact with the semiconductor substrate 12 within the scheduled dividing region 32. In this process, as shown in FIG. 3, with each of the front surface 12a and the back surface 12b of the semiconductor substrate 12, the probe 16 may be brought into contact only at one location within the scheduled dividing regions 32, or at multiple locations within the scheduled dividing regions 32. Further, the probe 16 may be brought into contact with the front surface 12a and the back surface 12b at locations other than the scheduled dividing regions 32.

Figure 4:
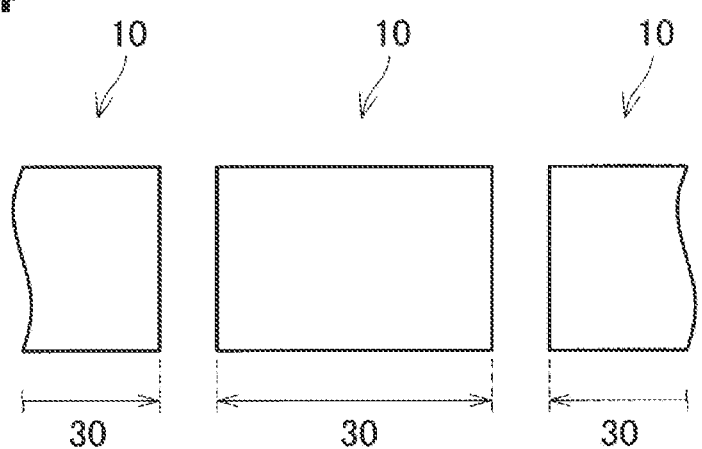
FIG. 4 is a cross-sectional view showing a state in which the semiconductor substrate is divided.

Next, an electric current is caused to flow in the semiconductor substrate 12 via each probe 16 being brought into contact with the semiconductor substrate 12. Since the dopant has been introduced into the high resistance region 34 within the scheduled dividing region 32, the high resistance region 34 has a higher resistance than a peripheral region. Therefore, when the electric current is caused to flow in the substrate 12, the temperature of the high resistance region 34 rises to a higher temperature than the peripheral region. As such, when the electric current is caused to flow in the substrate 12, a large thermal stress is applied to the high resistance region 34. Because the semiconductor substrate 12 is made of a compound semiconductor exhibiting an ionic bonding property, the polarity inside the crystal is likely to be disturbed when the electric current flows in the semiconductor substrate 12. Further, because the scheduled dividing region 32 is provided along the (100) plane and the (001) plane of β-$Ga_2O_3$, cleavage is likely to easily occur. For these reasons, in this process, when an electric power exceeding, for example, about 800 W/$cm^2$ is applied to the semiconductor substrate 12, the semiconductor substrate 12 can be divided along the scheduled dividing regions 32, as shown in FIG. 4. As a result, the semiconductor substrate 12 is divided into a plurality of semiconductor devices 10.

Second Embodiment

Figure 5:
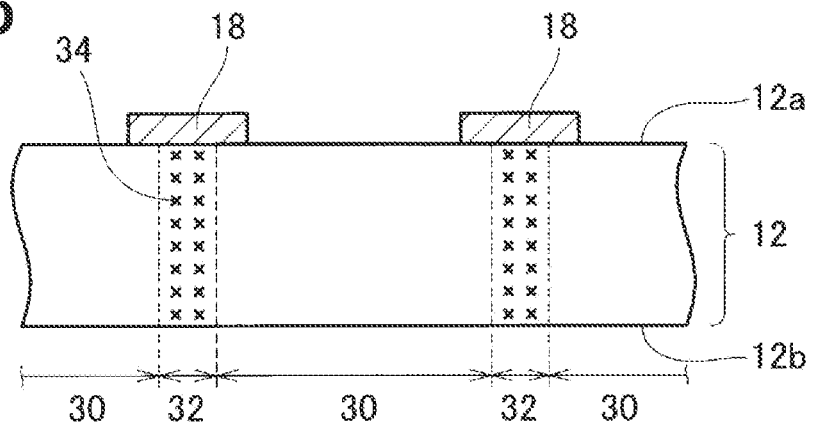
FIG. 5 is a cross-sectional view showing a process of arranging an electrode on a semiconductor substrate in a manufacturing method according to a second embodiment.

In a manufacturing method of a second embodiment, the technique of causing the electric current to flow in the semiconductor substrate 12 is different from that of the first embodiment. In the manufacturing method of the second embodiment, the process up to the process shown in FIG. 2 is the same as that of the first embodiment. In the second embodiment, after the process shown in FIG. 2, an electrode 18 is formed on the surface 12a of the semiconductor substrate 12 as shown in FIG. 5. In this case, the electrode 18 is formed along the scheduled dividing region 32 on the surface 12a of the semiconductor substrate 12. The electrode 18 can be, for example, an electrode that makes Schottky contact with the semiconductor substrate 12. The electrode 18 may be formed so as to cover the entire surfaces of the scheduled dividing regions 32 on the surface 12a of the semiconductor substrate 12, or may be formed intermittently on the surface of the scheduled dividing regions 32 on the surface 12a of the semiconductor substrate 12.

Figure 6:
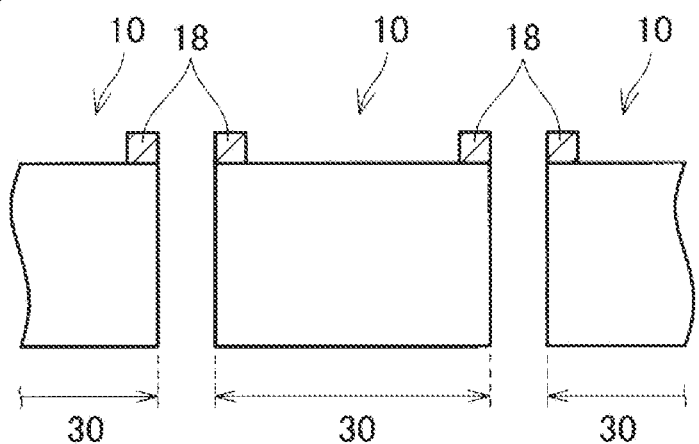
FIG. 6 is a cross-sectional view showing a state in which the semiconductor substrate is divided.

Next, an electric current is caused to flow in the semiconductor substrate 12 through the electrode 18 arranged on the surface 12a of the semiconductor substrate 12. For example, the electric current may be caused to flow between the electrode 18 and the back surface 12b of the semiconductor substrate 12. Then, by applying an electric power exceeding about 800 W/$cm^2$ to the semiconductor substrate 12, the semiconductor substrate 12 can be divided along the scheduled dividing regions 32 as in the first embodiment, as shown in FIG. 6. As a result, the semiconductor substrate 12 is divided into a plurality of semiconductor devices 10.

As described above, in the manufacturing methods of the first embodiment and the second embodiment, the semiconductor substrate 12 can be easily divided by applying the electric current through the semiconductor substrate 12. Therefore, the semiconductor substrate 12 can be divided in a short time, for example, as compared with the technique of dicing by a dicing blade conventionally used for dividing the semiconductor substrate. Further, in the embodiments described above, the semiconductor substrate 12 can be divided at low cost without the need for a dicing blade or a dicing tape for protecting the surface of the semiconductor substrate during the dicing.

Further, in the first and second embodiments described above, since the semiconductor substrate 12 is divided by utilizing the cleavage of the compound semiconductor caused by the electric current flowing through the semiconductor substrate 12, damage is unlikely to remain on the cut surface. Therefore, the cut surfaces are substantially uniform, and the semiconductor devices 10 can be manufactured with a high yield.

In the first and second embodiments described above, the entire semiconductor substrate 12 is made of β-$Ga_2O_3$. Alternatively, in the semiconductor substrate 12, only the scheduled dividing regions 32 may be made of β-$Ga_2O_3$. That is, a region other than the scheduled dividing regions 32 (for example, the element regions 30 or the like) may contain an element other than O and Ga.

Further, in the embodiments described above, the electric current is caused to flow between the front surface 12a and the back surface 12b of the semiconductor substrate 12. As another example, two or more probes or two or more electrodes 18 may be arranged at arbitrary positions on the front surface 12a of the semiconductor substrate 12, and the electric current may be caused to flow only in the vicinity of the front surface 12a of the semiconductor substrate, that is, in the surface layer portion adjacent to the front surface 12a. Alternatively, the electric current may be caused to flow only in the vicinity of the back surface 12b of the semiconductor substrate 12, in a similar manner.

In the first and second embodiments described above, the high resistance region 34 is formed by the ion-implantation of the dopant. The formation of the high resistance region 34 is not limited to the one by the ion-implantation of the dopant. The high resistance region 34 may be formed by introducing the dopant by epitaxial growth. As another example, the resistance of the scheduled dividing region 32 may be increased by introducing a dissimilar material different from the material constituting the semiconductor substrate 12 into the scheduled dividing region 32. For example, instead of the process shown in FIG. 2, a groove may be formed by etching from the surface 12a along the scheduled dividing region 32, and the inside of the groove may be filled with a dissimilar material (for example, $SiO_2$ or the like). In such a configuration, it is possible to form a high resistance region 34 extending from the surface 12a of the semiconductor substrate 12 to a predetermined depth (that is, the depth of the groove).

Further, in the first and second embodiments, the high resistance region 34 is formed by introducing the dopant. As another example, a high thermal resistance region having a thermal resistance higher than a peripheral region may be formed by introducing a dopant. The high thermal resistance region may be formed by introducing a dissimilar material described above. In the high thermal resistance region, when the electric current is caused to flow, heat tends to stagnate more easily than the peripheral region, and the temperature is likely to rise more than the peripheral region. Therefore, a large thermal stress can be applied also by forming such a high thermal resistance region. However, the high resistance region 34 and the high thermal resistance region described above may not be formed. That is, in the technique disclosed herein, it is not always necessary to have a process of introducing a dopant or a dissimilar material. Even in such a configuration, the semiconductor substrate 12 can be divided along the cleavage plane by causing the electric current to flow through the semiconductor substrate 12.

Figure 7:
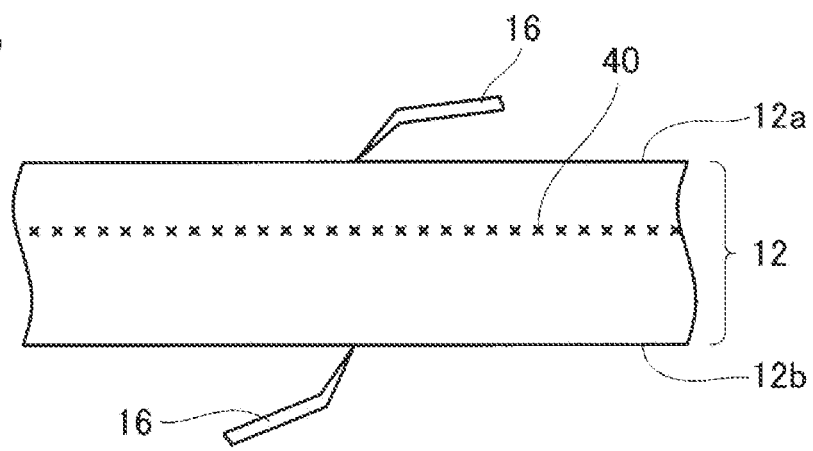
FIG. 7 is a cross-sectional view showing a process of dividing a semiconductor substrate along a planar direction of the semiconductor substrate in a manufacturing method according to a modified example.

In the first and second embodiments, the process for dividing the semiconductor substrate 12 into the semiconductor devices 10 has been mainly described. Alternatively, the techniques described as the first and second embodiments may be applied to, for example, a step of thinning the semiconductor substrate 12. For example, as shown in FIG. 7, a high resistance region 40 is formed by ion-implanting a dopant from the surface 12a of the semiconductor substrate 12 selectively to a desired depth. Then, the probes 16 are brought into contact with the front surface 12a and the back surface 12b of the semiconductor substrate 12 and the electric current is caused to flow in the semiconductor substrate 12 through the probes 16, so that the semiconductor substrate 12 can be divided along the high resistance region 40. By setting the surface along the high resistance region 40 to the (100) plane or the (001) plane of $\beta$-$Ga_2O_3$, that is, by setting the surface to be divided to the (100) plane or the (001) plane of $\beta$-$Ga_2O_3$, the semiconductor substrate 12 can be divided more easily. In this way, the semiconductor substrate 12 can be made thinner.

The formation of the high resistance region 40 is not limited to the mode by the ion-implantation of the dopant. For example, when the semiconductor substrate 12 is produced by epitaxial growth in the step of preparing the semiconductor substrate 12, a semiconductor material containing the dopant may be epitaxially grown at a depth where the high resistance region 40 is to be formed. Further, the semiconductor substrate 12 having the high resistance region 40 may be manufactured by using different materials.

In the first and second embodiments described above, the semiconductor substrate 12 is divided along the scheduled dividing regions 32 by applying the electric power exceeding about 800 W/cm$^2$ to the semiconductor substrate 12. In this process, a groove is formed from the surface 12a of the semiconductor substrate 12 in the thickness direction of the semiconductor substrate 12 along the scheduled dividing region 32 in the course of increasing the electric power applied to the semiconductor substrate 12. That is, the technique of the present disclosure is also useful as a technique for forming a groove on the surface 12a of the semiconductor substrate 12.

Third Embodiment

A manufacturing method of a third embodiment will be described hereinafter. The manufacturing method of the third embodiment is characterized by a process of bonding two semiconductor substrates 52 and 54 each made of a specific material described later. The manufacturing method of the third embodiment can be adopted for various semiconductor devices made of the specific material and their semi-finished products. Hereinafter, the process of bonding the semiconductor substrates 52 and 54 will be mainly described, and the description of other manufacturing processes will be omitted. The semiconductor substrate 52 and the semiconductor substrate 54 are examples of a "first substrate" and a "second substrate", respectively.

The semiconductor substrates 52 and 54 are made of the similar compound semiconductors as those in the first and second embodiments. That is, the semiconductor substrates 52 and 54 are made of $\beta$-$Ga_2O_3$. However, the material of the semiconductor substrates 52 and 54 is not limited to $\beta$-$Ga_2O_3$. As the material of the semiconductor substrates 52 and 54, a compound semiconductor containing a first element and a second element bonded to each other, and in which a difference in electronegativity between the first element and the second element is 1.5 or more can be used. Generally speaking, it is simply required that the semiconductor substrate 12 is made of a material having an ionic bonding property. In $\beta$-$Ga_2O_3$, O corresponds to the first element and has an electronegativity of 3.44, and Ga corresponds to the second element and has an electronegativity of 1.81. The compound semiconductor constituting the semiconductor substrate 12 may further contain an element different from the first element and the second element. Examples of the compound semiconductor constituting the semiconductor substrate 12 may include gallium oxide semiconductors such as $(Ga, Rh)_2O_3$, $(Ga, Ir)_2O_3$, $(Ga, Bi)_2O_3$, and $ZnGa_2O_4$, and other oxide semiconductors.

Figure 8:
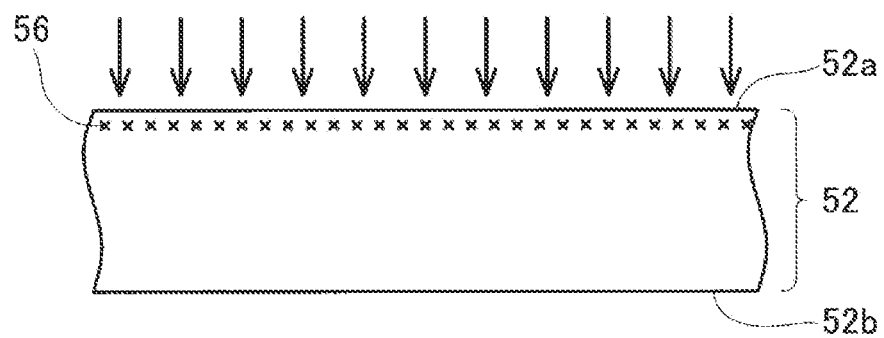
FIG. 8 is a cross-sectional view showing a process of implanting ions into the surface of a semiconductor substrate in a manufacturing method according to a third embodiment.
Figure 9:
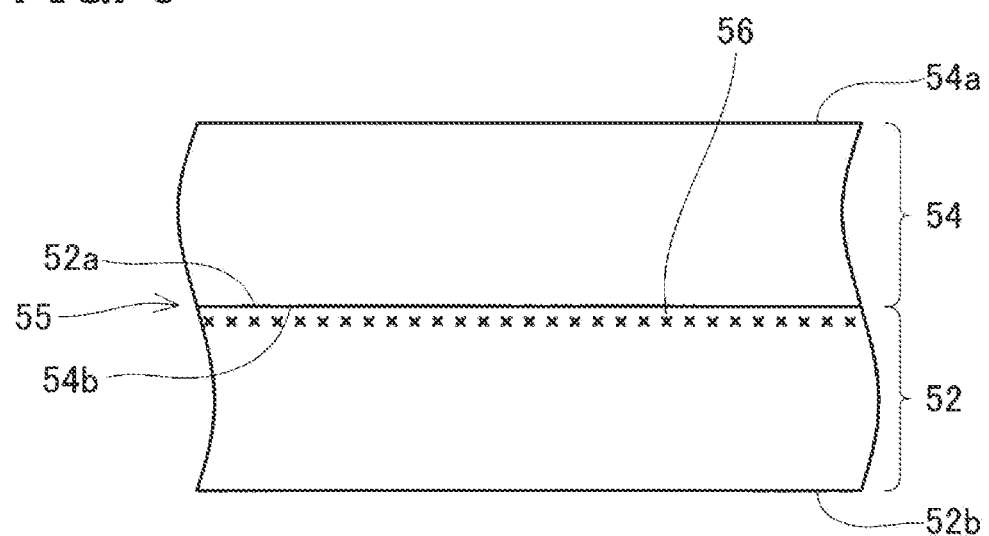
FIG. 9 is a cross-sectional view showing a process of stacking semiconductor substrates.
Figure 10:
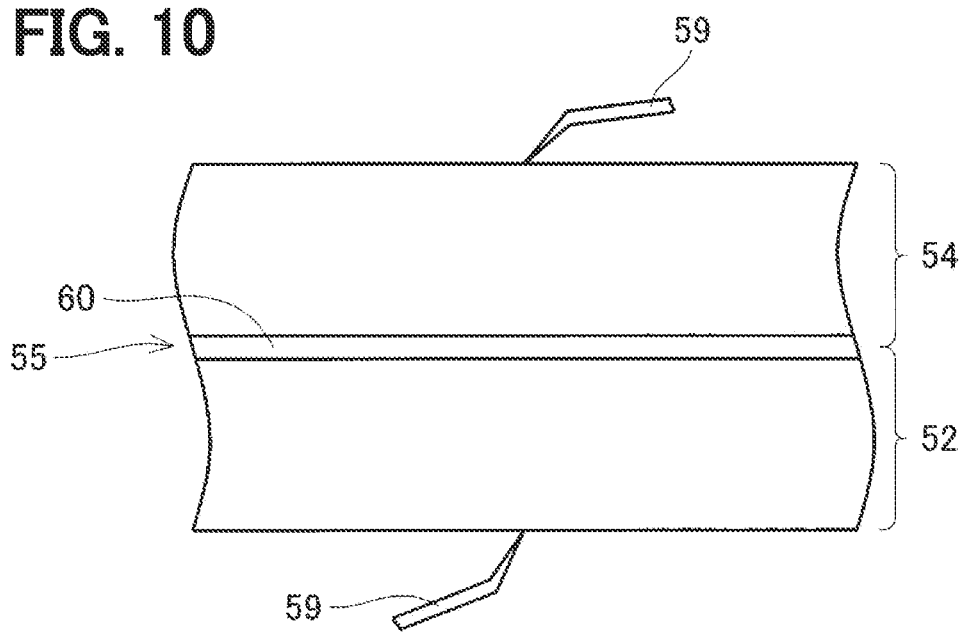
FIG. 10 is a cross-sectional view showing a process of causing an electric current to flow through the semiconductor substrates.

First, as shown in FIG. 8, a dopant is introduced into a surface 52a of the semiconductor substrate 52 by ion implantation. In this case, the dopant is introduced over the entire surface 52a of the semiconductor substrate 52. As a result, a high resistance region 56 in which ions are implanted is formed in a range facing the surface 52a of the semiconductor substrate 52, that is, in a surface layer portion of the surface 52a of the semiconductor substrate 52. The dopant to be introduced is not particularly limited, but for example, Fe or V can be used. Next, as shown in FIG. 9, the semiconductor substrate 54 is stacked on the surface 52a of the semiconductor substrate 52.

Next, the stacked semiconductor substrates 52 and 54 are annealed in an atmosphere containing oxygen. The atmosphere including oxygen means an atmosphere including oxygen as an element. For example, the semiconductor substrates 52 and 54 are annealed in an atmosphere of such as oxygen ($O_2$) gas. As a result, an interface 55 between the semiconductor substrate 52 and the semiconductor substrate 54 is made to have a high resistance. That is, in this process, the resistance in the region near the interface 55 of the semiconductor substrates 52 and 54 including the high resistance region 56 is further increased.

Thereafter, an electric current is caused to flow between the semiconductor substrate 52 and the semiconductor substrate 54. Specifically, as shown in FIG. 9, probes 59 are brought into contact with the front surface 54a of the semiconductor substrate 54 and the back surface 52b of the semiconductor substrate 52, respectively. Then, the electric current is caused to flow in the semiconductor substrates 52 and 54 via the probes 59. The high resistance region 56 has been formed in the surface 52a of the semiconductor substrate 52. Further, the resistance in the vicinity of the interface 55 between the semiconductor substrate 52 and the semiconductor substrate 54 has been increased by the annealing. Therefore, when the electric current is caused to flow through the stack of the semiconductor substrates 52 and 54, the temperature near the interface 55 rises to a higher temperature than the peripheral region. As a result, in the vicinity of the interface 55, a molten layer 60 in which the semiconductor material is melted is formed, and the crystal structure in the molten layer 60 is disturbed. Thereafter, when the flow of the electric current is stopped, the disordered crystal structures are rearranged again in the course of solidification of the molten layer 60, and the semiconductor substrate 52 and the semiconductor substrate 54 can be bonded to each other. As described above, in the manufacturing method of the third embodiment, the semiconductor substrates 52 and 54 can be easily bonded by causing the electric current to flow in the stacked semiconductor substrates 52 and 54.

In third embodiment, the entire semiconductor substrates 52 and 54 are made of β-Ga$_2$O$_3$. As another example, only the region near the front surface 52a of the semiconductor substrate 52 and the region near the back surface 54b of the semiconductor substrate 54, that is, only the regions facing the coupling surface may be made of β-Ga$_2$O$_3$.

In the third embodiment, the high resistance region 56 is formed by the ion-implantation of the dopant. As another example, the high resistance region 56 may be formed by epitaxially growing a semiconductor material containing a dopant on the surface 52a of the semiconductor substrate 52. As further another example, the high resistance region 56 may be formed by forming a dissimilar material (for example, SiO$_2$ or the like) different from the material constituting the semiconductor substrate 52 on the surface 52a.

In the third embodiment, the high resistance region 56 is formed in the surface layer portion adjacent to the front surface 52a of the semiconductor substrate 52. As another example, the high resistance region may be formed in the surface layer portion adjacent to the back surface 54a of the semiconductor substrate 54. Further, the high resistance region 56 may be formed in both the surface layer portion adjacent to the front surface 52a of the semiconductor substrate 52 and the surface layer portion adjacent to the back surface 54a of the semiconductor substrate 54.

In the third embodiment, the high resistance region 56 is formed by ion implantation. Alternative to or in addition to the high resistance region 56, a high thermal resistance region having a higher thermal resistance than the peripheral region may be formed by ion implantation. The high thermal resistance region may be formed by the dopant or dissimilar material as described above. In the high thermal resistance region, when the electric current is caused to flow, heat tends to stagnate more easily than in the peripheral region, and the temperature is likely to rise more than that in the peripheral region. Therefore, a large thermal stress can be caused by forming the high thermal resistance region. The high thermal resistance region may be formed in the surface layer portion near the front surface 52a of the semiconductor substrate 52, may be formed in the surface layer portion near the back surface 54a of the semiconductor substrate 54, or may be formed in these surface layer portions of both the semiconductor substrate 52 and the semiconductor substrate 54. Similarly, the thermal resistance of the interface 55 between the semiconductor substrate 52 and the semiconductor substrate 54 may be increased by annealing, alternative to or in addition to the process of increasing the resistance of the interface 55 by annealing. The high resistance region 56 and the high thermal resistance region described above may not be formed. That is, in the technique disclosed herein, it is not always necessary to provide the step of introducing a dopant or a dissimilar material. Further, it is not always necessary to have the annealing step. Even with such a configuration, the semiconductor substrates 52 and 54 can be bonded by causing the electric current to flow between the semiconductor substrates 52 and 54.

While only the selected exemplary embodiment and examples have been described to illustrate the present disclosure, it will be apparent to those skilled in the art from this disclosure that various changes and modifications can be made therein without departing from the scope of the disclosure as defined in the appended claims. Furthermore, the foregoing descriptions of the exemplary embodiments and examples according to the present disclosure are provided for illustration only, and not for the purpose of limiting the disclosure as defined by the appended claims and their equivalents.

What is claimed is:

1. A method for manufacturing a semiconductor device, comprising:
   preparing a substrate made of a compound semiconductor containing a first element and a second element that is bonded to the first element and has an electronegativity smaller than that of the first element by 1.5 or more;
   causing an electric current to flow in the substrate from a front surface through the substrate to a back surface in a thickness direction of the substrate or from the back surface through the substrate to the front surface in the thickness direction; and
   dividing the substrate at a position including a current region where the electric current is caused to flow and along a cleavage plane of the substrate.

2. The method according to claim 1, wherein
   in the causing of the electric current to flow, a probe is brought into contact with the substrate to cause the electric current to flow between the substrate and the probe.

3. The method according to claim 1, further comprising:
   forming an electrode on the front surface of the current region, wherein
   in the causing of the electric current to flow, the electric current is caused to flow in the substrate through the electrode.

4. The method according to claim 3, wherein
   in the forming of the electrode, the electrode is formed on the front surface of the current region along the cleavage plane.

5. The method according to claim 1, wherein
   the compound semiconductor is an oxide semiconductor; and
   the first element is oxygen.

6. The method according to claim 5, wherein
   the compound semiconductor is composed of β-Ga$_2$O$_3$, and
   the cleavage plane is a (100) crystal plane and/or a (001) crystal plane of β-Ga$_2$O$_3$.

7. A method for manufacturing a semiconductor device, comprising:
   preparing a substrate made of a compound semiconductor containing a first element and a second element that is bonded to the first element and has an electronegativity smaller than that of the first element by 1.5 or more;
   causing an electric current to flow in the substrate; and
   dividing the substrate at a position including a current region where the electric current is caused to flow and along a cleavage plane of the substrate,
   the method further comprising:
   increasing a resistance of the current region higher than that of a peripheral region on the periphery of the current region by introducing a dopant or a dissimilar material different from the compound semiconductor into the current region.

8. The method according to claim 7, wherein
   in the causing of the electric current to flow, a probe is brought into contact with the substrate to cause the electric current to flow between the substrate and the probe.

9. The method according to claim 7, further comprising:
   forming an electrode on a surface of the current region, wherein
   in the causing of the electric current to flow, the electric current is caused to flow in the substrate through the electrode.

10. The method according to claim 9, wherein
in the forming of the electrode, the electrode is formed on the surface of the current region along the cleavage plane.

11. The method according to claim 7, wherein
the compound semiconductor is an oxide semiconductor; and
the first element is oxygen.

12. The method according to claim 11, wherein
the compound semiconductor is composed of β-$Ga_2O_3$, and
the cleavage plane is a (100) crystal plane and/or a (001) crystal plane of β-$Ga_2O_3$.

13. A method for manufacturing a semiconductor device, comprising:
preparing a substrate made of a compound semiconductor containing a first element and a second element that is bonded to the first element and has an electronegativity smaller than that of the first element by 1.5 or more;
causing an electric current to flow in the substrate; and
dividing the substrate at a position including a current region where the electric current is caused to flow and along a cleavage plane of the substrate,
the method further comprising:
increasing a thermal resistance of the current region higher than that of a peripheral region on the periphery of the current region by introducing a dopant or a dissimilar material different from the compound semiconductor into the current region.

14. The method according to claim 13, wherein
in the causing of the electric current to flow, a probe is brought into contact with the substrate to cause the electric current to flow between the substrate and the probe.

15. The method according to claim 13, further comprising:
forming an electrode on a surface of the current region, wherein
in the causing of the electric current to flow, the electric current is caused to flow in the substrate through the electrode.

16. The method according to claim 15, wherein
in the forming of the electrode, the electrode is formed on the surface of the current region along the cleavage plane.

17. The method according to claim 13, wherein
the compound semiconductor is an oxide semiconductor; and
the first element is oxygen.

18. The method according to claim 17, wherein
the compound semiconductor is composed of β-$Ga_2O_3$, and
the cleavage plane is a (100) crystal plane and/or a (001) crystal plane of β-$Ga_2O_3$.

* * * * *